(12) United States Patent
de Valicourt et al.

(10) Patent No.: US 10,840,672 B2
(45) Date of Patent: Nov. 17, 2020

(54) MODE-LOCKED SEMICONDUCTOR LASER CAPABLE OF CHANGING OUTPUT-COMB FREQUENCY SPACING

(71) Applicant: Nokia Solutions and Networks OY, Espoo (FI)

(72) Inventors: Guilhem de Valicourt, Jersey City, NJ (US); Michael S. Eggleston, New York, NY (US)

(73) Assignee: Nokia Solutions and Networks OY, Espoo (FI)

( * ) Notice: Subject to any disclaimer, the term of this patent is extended or adjusted under 35 U.S.C. 154(b) by 0 days.

(21) Appl. No.: 15/680,505

(22) Filed: Aug. 18, 2017

(65) Prior Publication Data

US 2019/0058304 A1 Feb. 21, 2019

(51) Int. Cl.
*G02B 6/12* (2006.01)
*H01S 5/10* (2006.01)
(Continued)

(52) U.S. Cl.
CPC ........ *H01S 5/0657* (2013.01); *G02B 6/12004* (2013.01); *G02F 1/3136* (2013.01);
(Continued)

(58) Field of Classification Search
CPC ............ H01S 3/07; H01S 3/2375; H01S 3/1106–3/1121; H01S 5/0656;
(Continued)

(56) References Cited

U.S. PATENT DOCUMENTS

| | | | |
|---|---|---|---|
| 6,192,058 B1 * | 2/2001 | Abeles | G02B 6/4248 359/337.11 |
| 6,327,283 B1 * | 12/2001 | Hung | G02B 6/12004 372/23 |

(Continued)

FOREIGN PATENT DOCUMENTS

| | | | |
|---|---|---|---|
| WO | 9417448 | 8/1994 | |
| WO | 2016095265 A1 | 6/2016 | |
| WO | WO-2017131879 A1 * | 8/2017 | ......... G02B 6/12004 |

OTHER PUBLICATIONS

"Frequency Combs", www.rp-photonics.com/frequency_combs.html, 2006. (Year: 2006).*

(Continued)

*Primary Examiner* — Joshua King
(74) *Attorney, Agent, or Firm* — Mendelsohn Dunleavy, P.C.; Yuri Gruzdkov (57) ABSTRACT

A mode-locked semiconductor laser capable of changing the spacing between the carrier frequencies of its output comb. In an example embodiment, the mode-locked semiconductor laser is implemented as a hybrid solid-state device comprising a III-V semiconductor chip and a silicon chip attached to one another to form a laser cavity. The III-V semiconductor chip includes a gain medium configured to generate light in response to being electrically and/or optically pumped. The silicon chip includes a plurality of optical waveguides arranged to provide multiple optical paths of different effective lengths for the light generated in the laser cavity. Different optical paths can be controllably selected, using one or more optical switches connected between the optical waveguides, to change the effective optical length of the laser cavity and, as a result, the output-comb frequency spacing. In some embodiments, the output-comb frequency spacing can be changeable at least by a factor of 1.5.

21 Claims, 5 Drawing Sheets (51) Int. Cl.
*H01S 5/30* (2006.01)
*G02F 1/313* (2006.01)
*H01S 5/065* (2006.01)
*H01S 5/125* (2006.01)
*H01S 5/14* (2006.01)
*H01S 3/106* (2006.01)
*H01S 3/105* (2006.01)
*H01S 5/02* (2006.01)
*H01S 3/107* (2006.01)
*H01S 5/0625* (2006.01)
*H01S 5/026* (2006.01)

(52) U.S. Cl.
CPC .............. *H01S 3/105* (2013.01); *H01S 3/106* (2013.01); *H01S 5/1003* (2013.01); *H01S 5/1007* (2013.01); *H01S 5/1025* (2013.01); *H01S 5/1039* (2013.01); *H01S 5/125* (2013.01); *H01S 5/141* (2013.01); *H01S 5/3013* (2013.01); *G02B 2006/12145* (2013.01); *G02B 2006/12159* (2013.01); *H01S 3/107* (2013.01); *H01S 5/021* (2013.01); *H01S 5/026* (2013.01); *H01S 5/06256* (2013.01)

(58) Field of Classification Search
CPC .... H01S 5/1025; H01S 5/1007; H01S 5/1039; H01S 5/1028–5/1032; H01S 5/1003–5/1017; H01S 5/0657; G02F 1/3136; G02F 1/3137; G02B 6/12004; G02B 2006/12145; G02B 2006/12159; G02B 6/35; G02B 6/351–6/3536
See application file for complete search history.

(56) References Cited

U.S. PATENT DOCUMENTS

| | | | |
|---|---|---|---|
| 6,631,145 B1 | 10/2003 | Tamura et al. | |
| 6,671,298 B1* | 12/2003 | Delfyett | H01S 5/14 372/26 |
| 7,565,084 B1* | 7/2009 | Wach | H04B 10/506 398/183 |
| 7,680,362 B2 | 3/2010 | Rasras | |
| 7,706,536 B2 | 4/2010 | Dinu et al. | |
| 7,733,923 B2 | 6/2010 | Doerr | |
| 8,014,676 B2 | 9/2011 | Chen et al. | |
| 8,073,333 B2 | 12/2011 | Bernasconi et al. | |
| 8,885,679 B1 | 11/2014 | Roth et al. | |
| 9,083,457 B1 | 7/2015 | Wach | |
| 9,450,379 B2 | 9/2016 | Zhang et al. | |
| 9,455,862 B2 | 9/2016 | Karaki et al. | |
| 9,559,487 B2 | 1/2017 | Doerr | |
| 9,617,594 B2 | 4/2017 | Rothberg et al. | |
| 2002/0064353 A1* | 5/2002 | Yokoyama | G02B 6/4292 385/92 |
| 2003/0123784 A1* | 7/2003 | Mukai | H01S 5/14 385/15 |
| 2003/0198259 A1* | 10/2003 | Zhang | G02B 6/12004 372/20 |
| 2006/0013273 A1 | 1/2006 | Menon et al. | |
| 2006/0140533 A1* | 6/2006 | Sinsky | G02B 6/12004 385/14 |
| 2009/0310641 A1* | 12/2009 | Kimura | G02B 6/0026 372/99 |
| 2010/0246612 A1* | 9/2010 | Shimizu | H01S 5/0602 372/18 |
| 2012/0195332 A1* | 8/2012 | Yoffe | H01S 5/1032 372/20 |
| 2013/0235890 A1* | 9/2013 | Creazzo | H01S 5/142 372/20 |
| 2013/0287051 A1* | 10/2013 | Kim | H01S 3/13 372/25 |
| 2013/0308662 A1* | 11/2013 | Frisken | H01S 3/1055 372/18 |
| 2014/0133511 A1* | 5/2014 | Tanaka | H01S 5/0687 372/50.11 |
| 2014/0240509 A1 | 8/2014 | Nakayama | |
| 2015/0078764 A1 | 3/2015 | Karaki et al. | |
| 2015/0139640 A1 | 5/2015 | Jopson et al. | |
| 2015/0207291 A1* | 7/2015 | Rickman | H01S 5/142 372/20 |
| 2015/0207296 A1* | 7/2015 | Rickman | H01S 5/142 372/20 |
| 2016/0315451 A1* | 10/2016 | de Valicourt | H01S 5/1007 |

OTHER PUBLICATIONS

Merlier, Jan De, et al., "Wavelength Tunable Laser With Intracavity Wavelength Reference Etalon," Journal of Lightwave Technology, vol. 24, No. 8, 2006, pp. 3202-3209.

Dong, Po, et al., "Reconfigurable 100 Gb/s Silicon Photonic Network-on-Chip [Invited]," IEEE/OSA Journal of Optical Communications and Networking vol. 7, No. 1/Jan. 2015, pp. A37-A43.

Koch, Brian R., et al., "Mode-locked silicon evanescent lasers," Optics Express, vol. 15, No. 18, 2007, pp. 11225-11233.

K. Merghem, et al., "Pulse generation at 346 GHz using a passively mode locked quantum-dash-based laser at 1.55 1.55 μm," Applied Physics Letters 94, 2009, pp. 021107-1-021107-3.

Nagatsuma,Tadao, et al., "Terahertz wireless communications based on photonics technologies," Optics Express, vol. 21, No. 20, 2013, pp. 23736-23747.

Srinivasan, Sudharsanan, et al., "Harmonically Mode-Locked Hybrid Silicon Laser With Intra-Cavity Filter to Suppress Supermode Noise," IEEE Journal of Selected Topics in Quantum Electronics, vol. 20, No. 4, 2014, (8 pages).

Van Dijk, Frédéric, et al., "Quantum Dash mode-locked laser for millimeter-wave Coupled Opto-Electronic Oscillator," IEEE International Topical Meeting on Microwave Photonics, IEEE Xplore, 2007, pp. 66-69.

Zhang, Di, et al., "Compact MEMS external cavity tunable laser with ultra-narrow linewidth for coherent detection," Optical Society of America, Optics Express, vol. 20, No. 18, 2012, pp. 19670-19682.

International Search Report and Written Opinion; dated Dec. 19, 2018 for PCT Application No. PCT/US2018/046869.

Arahira, S., et al. "Repetition-frequency tuning of monolithic passively mode-locked semiconductor lasers with Integrated extended cavities." IEEE journal of quantum electronics 33.2 (1997): 255-264.

Van Dijk, F., et al. "Quantum dash mode-locked lasers for millimeter wave signal generation and transmission." 2010 23rd Annual Meeting of the IEEE Photonics Society. IEEE (2010): pp. 187-188.

* cited by examiner

MODE-LOCKED SEMICONDUCTOR LASER CAPABLE OF CHANGING OUTPUT-COMB FREQUENCY SPACING

BACKGROUND

Field

The present disclosure relates to light sources and, more specifically but not exclusively, to a mode-locked (ML) semiconductor laser capable of changing the spacing between carrier frequencies of the output comb.

Description of the Related Art

This section introduces aspects that may help facilitate a better understanding of the disclosure. Accordingly, the statements of this section are to be read in this light and are not to be understood as admissions about what is in the prior art or what is not in the prior art.

Optical transport systems are often designed to transmit information using wavelength-division-multiplexed (WDM) signals. The generation of WDM signals in such systems relies on light sources capable of producing electromagnetic radiation at appropriate multiple carrier wavelengths (frequencies). One such light source is a mode-locked (ML) semiconductor laser, which owes its utility to its relatively small size, high power, low noise, and low cost. However, a conventional ML semiconductor laser is typically incapable of changing the spacing between carrier frequencies of its output comb.

SUMMARY OF SOME SPECIFIC EMBODIMENTS

Disclosed herein are various embodiments of an ML semiconductor laser capable of changing the spacing between the carrier frequencies of its output comb. In an example embodiment, the ML semiconductor laser is implemented as a hybrid solid-state device comprising a III-V semiconductor chip and a silicon chip attached to one another to form a laser cavity. The III-V semiconductor chip includes a gain medium configured to generate light in response to being electrically and/or optically pumped. The silicon chip includes a plurality of optical waveguides arranged to provide multiple optical paths of different effective lengths for the light generated in the laser cavity. Different optical paths can be controllably selected, using one or more optical switches connected between the optical waveguides, to change the effective optical length of the laser cavity and, as a result, the output-comb frequency spacing. In some embodiments, the output-comb frequency spacing can advantageously be changeable at least by a factor of 1.5.

According to an example embodiment, provided is an apparatus comprising: a laser cavity including an optical waveguide and a waveguide circuit connected between a first light reflector and a second light reflector, the optical waveguide including an active section and a mode-locking section, the active section being configured to generate light in response to an electrical current being driven therethrough, the mode-locking section being configured to modulate the light to cause an optical pulse train to be emitted from the laser cavity through the first light reflector or the second light reflector; wherein the waveguide circuit comprises one or more optical switches configured to connect the optical waveguide and the second light reflector using a plurality of optical paths through the waveguide circuit; and wherein at least two of the plurality of optical paths have different respective optical lengths.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Mode locking is a method of obtaining ultra-short optical pulses from a laser that is typically referred to as a mode-locked (ML) laser. An example optical cavity of an ML laser contains an active modulating element (e.g., an optical modulator) or a passive modulating element (e.g., a saturable absorber) or both, which causes formation of one or more ultra-short pulses circulating in the cavity. Each time a circulating pulse hits the output coupler (e.g., a partially transparent mirror), light is emitted from the laser, thereby producing an optical pulse train. The number of pulses in the laser cavity and their round-trip time therein determine the pulse-repetition rate of the optical pulse train. For a typical ML semiconductor laser, the pulse-repetition rate can be in the gigahertz range. The duration of each pulse in the optical pulse train is determined by the characteristics of the optical modulator and/or saturable absorber and typically falls into the femtosecond to picosecond time range.

Active mode locking (e.g., using an acousto-optic or electro-optic modulator, a Mach-Zehnder integrated-optic modulator, or a semiconductor electro-absorption modulator) produces optical pulses that are in synchronism with the signal that drives the modulator. To achieve stable operation that enables the timing jitter to be relatively low and chaotic lasing behavior to be avoided, the period of the driving signal may need to be adjusted such that an integer multiple thereof substantially matches the round-trip time in the laser cavity.

Passive mode locking with a saturable absorber generally results in much shorter optical pulses compared to those obtained with active mode locking, e.g., because a typical passive saturable absorber can modulate cavity losses much faster than a typical active optical modulator, provided that the saturable absorber has a sufficiently small recovery time. Saturable absorbers for passive mode locking can be real absorber devices or artificial saturable absorbers, e.g., those based on Kerr-lens mode locking or additive-pulse mode locking.

Hybrid mode locking typically involves some combination of active and passive mode locking and can typically be used in monolithic semiconductor lasers. Although hybrid mode locking adds complexity to the overall laser structure, it provides flexibility in achieving the desired laser characteristics and offers some advantages and/or benefits of both active and passive mode locking techniques.

The spectrum of an optical pulse train produced by an ML laser is composed of discrete spectral lines separated from one another by a fixed frequency interval substantially equal to the pulse repetition rate. As such, the optical spectrum of an ML laser is often referred to as a frequency comb. Typically, characteristics of the semiconductor gain medium and certain effects of intra-cavity dispersion and/or intra-cavity nonlinearities determine the total spectral width of the frequency comb, which in turn determines the number of usable comb lines in the output of the laser.

Figure 1:
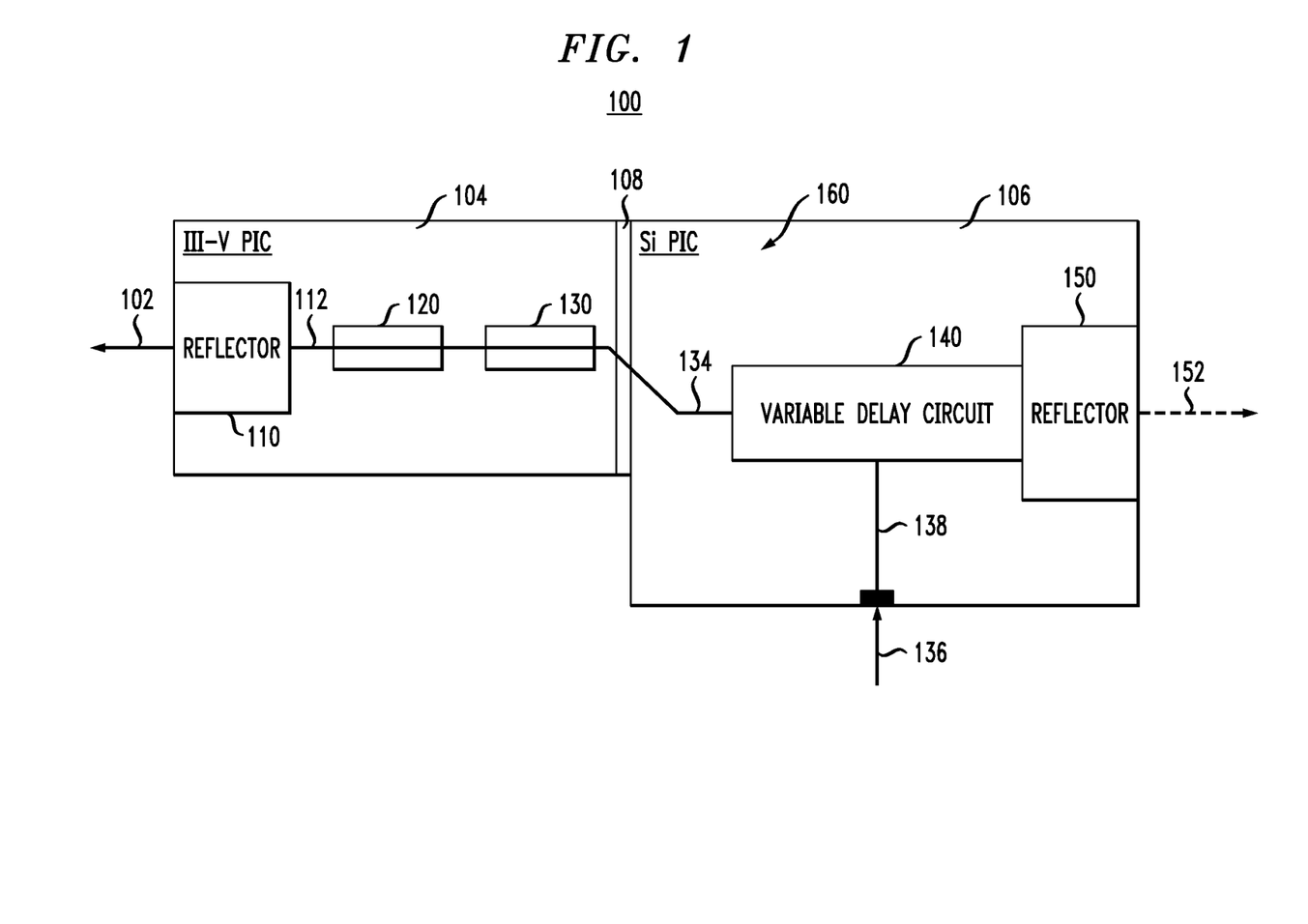
FIG. 1 shows a schematic diagram of an ML semiconductor laser according to an embodiment.

FIG. 1 shows a schematic diagram of an ML semiconductor laser 100 according to an embodiment. Laser 100 comprises a laser cavity 160 bounded by light reflectors 110 and 150. In an example embodiment, laser cavity 160 includes an active section 120, a mode-locking element 130, and a variable-delay circuit 140. Light reflector 110, active section 120, and mode-locking element 130 are parts of a photonic integrated circuit (PIC, chip) 104. Variable-delay circuit 140 and light reflector 150 are parts of a PIC (chip) 106. PICs 104 and 106 can be fabricated independently and then attached to one another to form laser cavity 160, e.g., using a chip coupler 108 configured to connect an optical waveguide 112 of PIC 104 and an optical waveguide 134 of PIC 106.

In an example embodiment, PIC 104 can be a semiconductor chip fabricated using the III/V-semiconductor technology. PIC 106 can be a semiconductor chip fabricated using a silicon-on-insulator (SOI) platform and/or the CMOS technology. Chip coupler 108 can be implemented and/or fabricated, as known in the pertinent art, using one or more of the following: (i) one or more lenses; (ii) one or more mirrors; (iii) an optical chip-edge coupler; (iv) a butt-coupling arrangement; (v) a vertical grating coupler; (vi) a molecular bonding technique; and (vii) heteroepitaxy.

Light reflector 110 is a partially transparent light reflector that operates as an output coupler of laser 100. More specifically, light reflector 110 is configured to (i) reflect a first portion of the light received from the inside of laser cavity 160 back into the laser cavity and (ii) transmit a second portion of the light received from the inside of laser cavity 160 out of the laser cavity. The transmitted second portion forms an optical output beam 102.

In a fixed lasing configuration of laser 100, the spectrum of optical output beam 102 comprises a frequency comb (see, e.g., 410-440, FIGS. 4A-4D), wherein peaks of adjacent comb lines are separated from one another by a corresponding fixed frequency spacing, $\Delta f$. The frequency spacing $\Delta f$ can be changed by changing the configuration of laser cavity 160, e.g., as further explained below. Example spectra of optical output beam 102 that can be generated in this manner are shown in FIGS. 4A-4D.

In some embodiments, light reflector 110 can be tunable in a manner that can controllably change its transmittance and reflectance. This feature can be used, e.g., to adjust the power ratio between the above-mentioned first and second light portions, as appropriate or necessary for a particular embodiment and/or intended application of laser 100.

Active section 120 includes an optical gain medium optically coupled to optical waveguide 112 of PIC 104 in a manner that enables the light generated in the optical gain medium to couple into that optical waveguide. In an example embodiment, active section 120 may comprise any suitable set of III-V semiconductor materials, e.g., selected from GaAs, InP, AlGaAs, InGaAsP, AlGaInP, and/or other suitable materials known in the pertinent art. The semiconductor materials used in active section 120 may be arranged to form a semiconductor optical amplifier (SOA) or a light-emitting diode that can generate light in response to being electrically and/or optically pumped. In some embodiments, active section 120 may be implemented using a heterostructure laser diode and/or a quantum-well laser diode.

Mode-locking element 130 may be an active mode-locking element, a passive mode-locking element, or a hybrid mode-locking element, e.g., implemented as known in the pertinent art and/or indicated above.

Variable-delay circuit 140 may have a plurality of optical waveguides (see, e.g., FIG. 3) arranged to provide multiple optical paths between (i) an optical waveguide 134 connected at one side of the variable-delay circuit and (ii) light reflector 150 connected at the other side of the variable-delay circuit. Different optical paths through variable-delay circuit 140 can be controllably selected, e.g., in response to a set of one or more electrical control signals 136 applied to an electrical bus 138 of PIC 106, in a manner that changes the effective optical length of the variable-delay circuit and, as a result, of laser cavity 160. Example embodiments of variable-delay circuit 140 are described in more detail below in reference to FIGS. 2-5.

In an example embodiment, light reflector 150 may have the reflectance that approaches 100%, which causes this light reflector to reflect substantially all of the light that impinges thereon from the inside of laser cavity 160 back into the laser cavity. In some embodiments, light reflector 150 may have a respective individual mirror coupled to an end of each individual optical path through variable-delay circuit 140. In some embodiments, light reflector 150 may have one or more mirrors, each of which is shared by two or more respective optical paths through variable-delay circuit 140. In some embodiments, light reflector 150 may have a mirror that is shared by all optical paths through variable-delay circuit 140.

In some embodiments, light reflector 150 can be a partially transparent light reflector that operates as an output coupler of laser 100. In such embodiments, the portion of the light transmitted by light reflector 150 forms an optical output beam 152. In an example embodiment, optical output beam 152 has optical characteristics (e.g., pulse-repetition rate and frequency spacing $\Delta f$) that are generally similar to those of optical output beam 102.

In operation, the light applied by optical waveguide 134 to variable-delay circuit 140 travels through the selected optical path of the latter to light reflector 150, is reflected by light reflector 150, and travels back through the selected optical path of variable-delay circuit 140 to optical waveguide 134. Since the frequency spacing $\Delta f$ of optical output beam 102 (and/or 152) depends on the round-trip time of a light pulse through laser cavity 160, the value of $\Delta f$ can be changed by appropriately reconfiguring variable-delay circuit 140 to select optical paths of different lengths. This feature of laser 100 is described in more detail below in reference to FIGS. 2-5.

Figure 2:
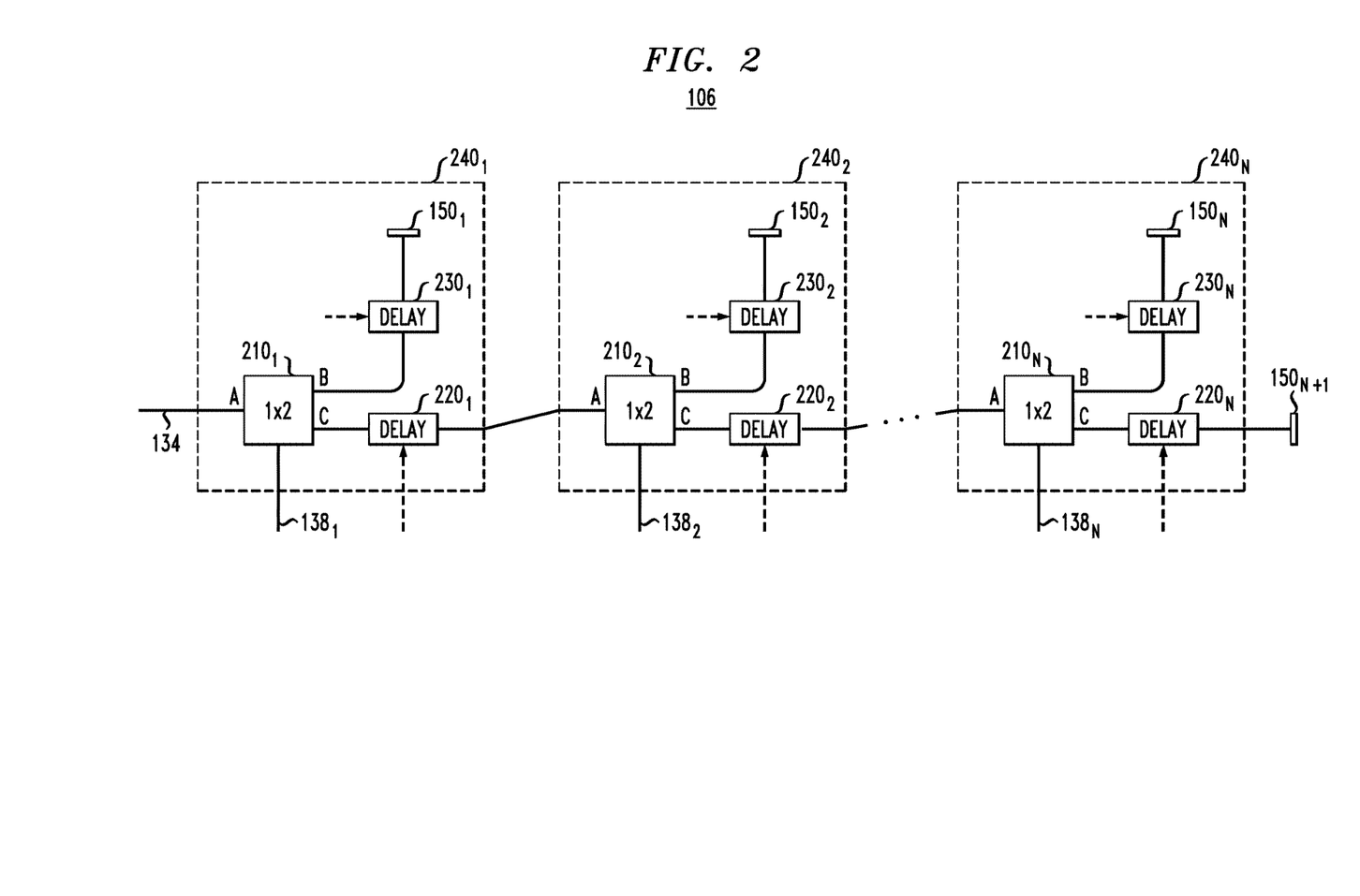
FIG. 2 shows a block diagram of a photonic integrated circuit (PIC) that can be used in the ML semiconductor laser of FIG. 1 according to an embodiment.

FIG. 2 shows a block diagram of PIC 106 according to an embodiment. In the shown embodiment, PIC 106 comprises N serially connected stages $240_1$-$240_N$, where N is a positive integer. Although the block diagram shown in FIG. 2 represents an embodiment in which N≥3, embodiments in which N=2 can be constructed as well, e.g., in a similar manner. In some embodiments, the number N of stages 240 can be reduced to one.

Each stage $240_i$ (where i=1, 2, ..., N) comprises a 1×2 switch $210_i$, delay elements $220_i$ and $230_i$, and a mirror $150_i$. The three ports of switch $210_i$ are labeled A, B, and C. Stage $240_1$ is connected to optical waveguide 134 (also see FIG. 1) at one side thereof and to stage $240_2$ at the other side thereof, as indicated in FIG. 2. Each stage $240_j$ (where j=2, ..., N−1) is connected to stage $240_{j-1}$ at one side thereof and to stage $240_{j+1}$ at the other side thereof. Stage $240_N$ is connected to stage $240_{N-1}$ at one side thereof and to mirror $150_{N+1}$ at the other side thereof. Each of minors $150_1$-$150_{N+1}$ is a part of reflector 150 (FIG. 1).

The state of each switch $210_i$ can be controlled, e.g., by applying an appropriate control signal to the corresponding line $138_i$ of electrical bus 138 (also see FIG. 1). In response to this control signal, switch $210_i$ can go into a first state or into a second state. In the first state, switch $210_i$ connects the ports A and B thereof. In the second state, switch $210_i$ connects the ports A and C thereof.

Port B of switch $210_i$ is connected to an optical path that includes delay element $230_i$ and mirror $150_i$. Port C of switch $210_i$ is connected to an optical path that includes delay element $220_i$. Port C of switch $210_N$ is further connected to minor $150_{N+1}$.

Figure 3:
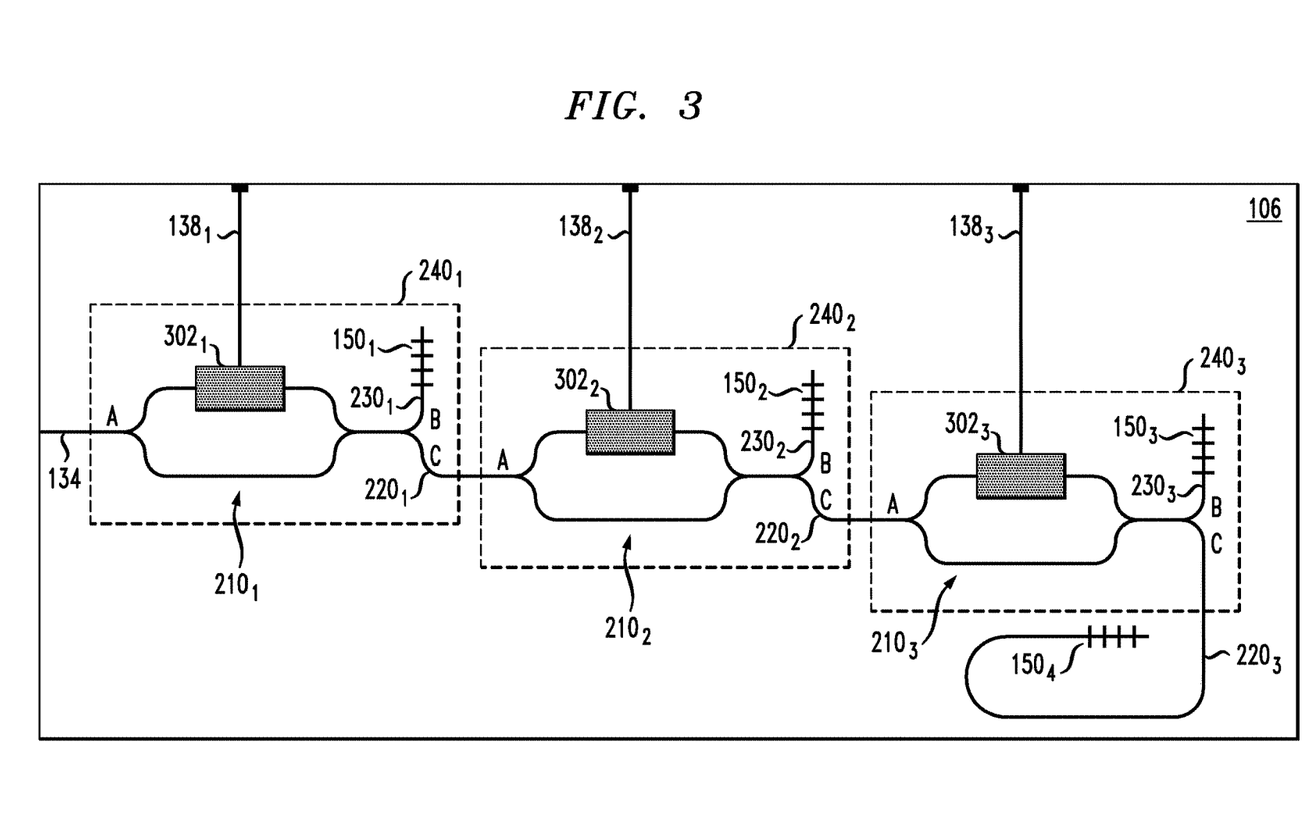
FIG. 3 shows a schematic top view of a PIC that can be used to implement the PIC of FIG. 2 according to an example embodiment.

In some embodiments, delay elements $220_i$ and $230_i$ can be fixed delay elements, e.g., comprising a fixed length of an optical waveguide (see, e.g., FIG. 3). In some other embodiments, at least one of delay elements $220_i$ and $230_i$ can be a tunable delay element controllable by a corresponding control signal (shown in FIG. 2 as a corresponding dashed arrow). Tunable delay elements that can be used for this purpose in PIC 106 are disclosed, e.g., in U.S. Pat. No. 8,073,333, which is incorporated herein by reference in its entirety.

In operation, control signals applied to electrical bus 138 can be used to configure stages $240_1$-$240_N$ to select one of at least (N+1) different optical paths provided by these stages for light traveling between optical waveguide 134 and light reflector 150.

For example, if switch $210_1$ is configured to be in the first state, then light received from optical waveguide 134 travels through delay element $230_1$, is reflected from mirror $150_1$, and travels back through delay element $230_1$ to optical waveguide 134. If switches $210_1$ and $210_2$ are configured to be in the second state and first state, respectively, then light received from optical waveguide 134 travels through delay elements $220_1$ and $230_2$, is reflected from mirror $150_2$, and travels back through delay elements $230_2$ and $220_1$ to optical waveguide 134. If switches $210_1$-$210_{N-1}$ are each configured to be in the second state, and switch $210_N$ is configured to be in the first state, then light received from optical waveguide 134 travels through delay elements $220_1$-$220_{N-1}$ and $230_N$, is reflected from mirror $150_N$, and travels back through delay elements $230_N$ and $220_{N-1}$-$220_1$ to optical waveguide 134. If switches $210_1$-$210_N$ are each configured to be in the second state, then light received from optical waveguide 134 travels through delay elements $220_1$-$220_N$, is reflected from mirror $150_{N+1}$, and travels back through delay elements $220_N$-$220_1$ to optical waveguide 134. Provided that the optical lengths of delay elements $220_1$-$220_N$ and $230_1$-$230_N$ are appropriately selected, the shown embodiment of PIC 106 can be used to change the effective length of laser cavity 160 such that at least (N+1) different effective cavity lengths can be realized. As a result, the corresponding embodiment of laser 100 can be reconfigured to generate optical output beam 102 such that its spectrum comprises a selected one of at least (N+1) differently spaced frequency combs corresponding to the above-indicated different configurations of switches $210_1$-$210_N$ and delay elements $220_1$-$220_N$ and $230_1$-$230_N$. An example of this feature corresponding to N=3 is graphically illustrated in FIGS. 4A-4D.

FIG. 3 shows a schematic top view of a PIC that can be used to implement PIC 106 of FIG. 2 according to an example embodiment. More specifically, the embodiment of PIC 106 shown in FIG. 3 corresponds to N=3 and has three serially connected stages $240_1$-$240_3$ (also see FIG. 2). Each of switches $210_1$-$210_3$ in the stages $240_1$-$240_3$ of FIG. 3 is implemented using a respective Mach-Zehnder interferometer (MZI). One of the interferometer arms includes a respective one of phase shifters $302_1$-$302_3$ connected to receive a respective bias voltage by way of the respective one of electrical lines $138_1$-$138_3$ (also see FIGS. 1-2). Each of delay elements $220_1$-$220_N$ and $230_1$-$230_N$ shown in FIG. 3 is a fixed delay element implemented using a respective length of optical waveguide in PIC 106. Each of mirrors $150_1$-$150_4$ shown in FIG. 3 is implemented as a respective distributed Bragg reflector (DBR).

In operation, the bias voltage applied to phase shifter $302_i$ by way of electrical line $138_i$ can be selected such that the optical beams propagating through the two arms of MZI switch $210_i$ interfere constructively at port B thereof and destructively at port C thereof, or vice versa. The former bias voltage configures MZI switch $210_i$ to be in the above-described first state, while the latter bias voltage configures MZI switch $210_i$ to be in the above-described second state.

Using different combinations of bias voltages applied to phase shifters $302_1$-$302_3$, the following four different optical paths can be selected for the light propagating through PIC 106 of FIG. 3.

If MZI switch $210_1$ is configured to be in the first state, then light received from optical waveguide 134 travels through optical waveguide $230_1$, is reflected from DBR mirror $150_1$, and travels back through optical waveguide $230_1$ to optical waveguide 134.

If MZI switches $210_1$ and $210_2$ are configured to be in the second state and first state, respectively, then light received from optical waveguide 134 travels through optical waveguides $220_1$ and $230_2$, is reflected from DBR mirror $150_2$, and travels back through optical waveguides $230_2$ and $220_1$ to optical waveguide 134.

If MZI switches $210_1$-$210_2$ are each configured to be in the second state, and switch $210_3$ is configured to be in the first state, then light received from optical waveguide 134 travels through optical waveguides $220_1$-$220_2$ and $230_3$, is reflected from mirror $150_3$, and travels back through optical waveguides $230_3$ and $220_2$-$220_1$ to optical waveguide 134.

If MZI switches $210_1$-$210_3$ are each configured to be in the second state, then light received from optical waveguide 134 travels through optical waveguides $220_1$-$220_3$, is reflected from mirror $150_4$, and travels back through optical waveguides $220_3$-$220_1$ to optical waveguide 134.

FIGS. 4A-4D graphically show example spectra 410-440 of optical output beam 102 that can be generated by laser 100 having PIC 106 of FIG. 3 according to an embodiment. Each of spectra 410-440 comprises a respective frequency comb, in which the intensities of individual comb lines are limited by a gain envelope 402 of PIC 104 (FIG. 1). The output-comb frequency spacing Δf and the number of comb lines within gain envelope 402 in spectra 410-440 depend on the effective length of laser cavity 160, which can be changed as described above in reference to FIG. 3, by reconfiguring MZI switches $210_1$-$210_3$.

Figure 4A:
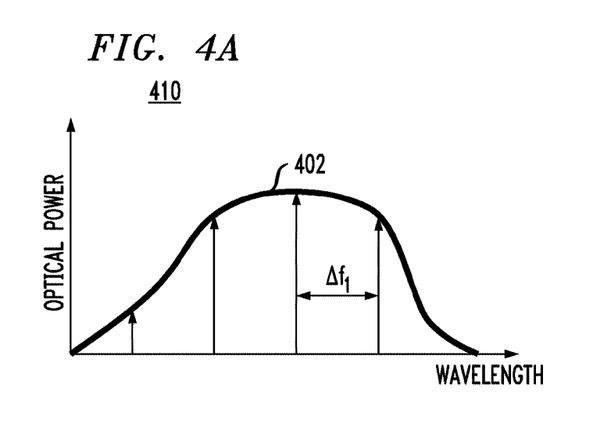
FIGS. 4A-4D graphically show example spectra of the optical output beam that can be generated by the ML semiconductor laser of FIG. 1 having the PIC of FIG. 3 according to an embodiment.

Spectrum 410 shown in FIG. 4A corresponds to a configuration of PIC 106 in which the effective length of laser cavity 160 is the length of the optical path between light reflector 110 (FIG. 1) and DBR mirror $150_1$ (FIG. 3). The corresponding output-comb frequency spacing is $\Delta f_1$.

Figure 4B:
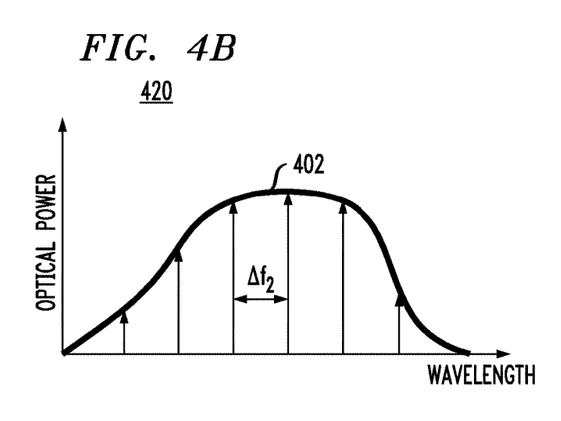

Spectrum 420 shown in FIG. 4B corresponds to a configuration of PIC 106 in which the effective length of laser cavity 160 is the length of the optical path between light reflector 110 (FIG. 1) and DBR mirror $150_2$ (FIG. 3). The corresponding output-comb frequency spacing is $\Delta f_2$, which is smaller than $\Delta f_1$.

Figure 4C:
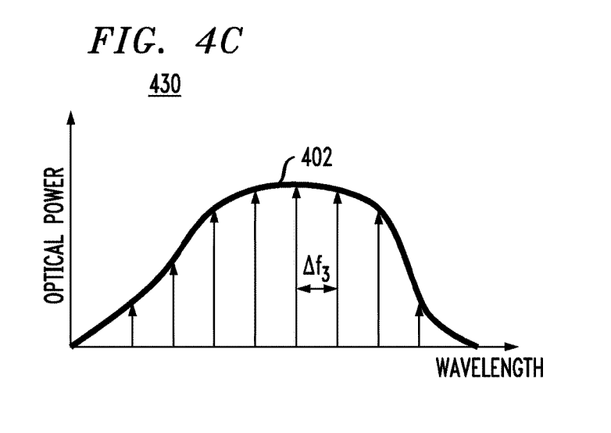

Spectrum 430 shown in FIG. 4C corresponds to a configuration of PIC 106 in which the effective length of laser cavity 160 is the length of the optical path between light reflector 110 (FIG. 1) and DBR mirror $150_3$ (FIG. 3). The corresponding output-comb frequency spacing is $\Delta f_3$, which is smaller than $\Delta f_2$.

Figure 4D:
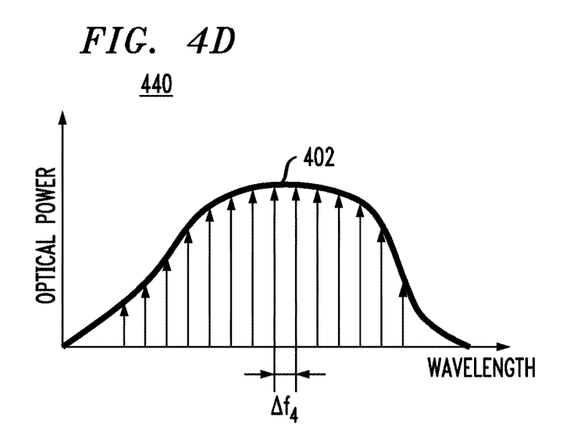

Spectrum 440 shown in FIG. 4D corresponds to a configuration of PIC 106 in which the effective length of laser cavity 160 is the length of the optical path between light reflector 110 (FIG. 1) and DBR mirror $150_4$ (FIG. 3). The corresponding output-comb frequency spacing is $\Delta f_4$, which is smaller than $\Delta f_3$.

The example illustrated by FIGS. 4A-4D corresponds to an embodiment in which the lengths of different optical waveguides 220 and 230 in stages $240_1$-$240_3$ shown in FIG. 3 are such that $\Delta f_1 = 1.5 \ \Delta f_2 = 2 \ \Delta f_3 = 4 \ \Delta f_4$. A person of ordinary skill in the art will understand that other desired ratios between the values of $\Delta f_1$, $\Delta f_2$, $\Delta f_3$, and $\Delta f_4$ can similarly be obtained by properly selecting the lengths of different optical waveguides 220 and 230 in stages $240_1$-$240_3$ shown in FIG. 3.

Figure 5:
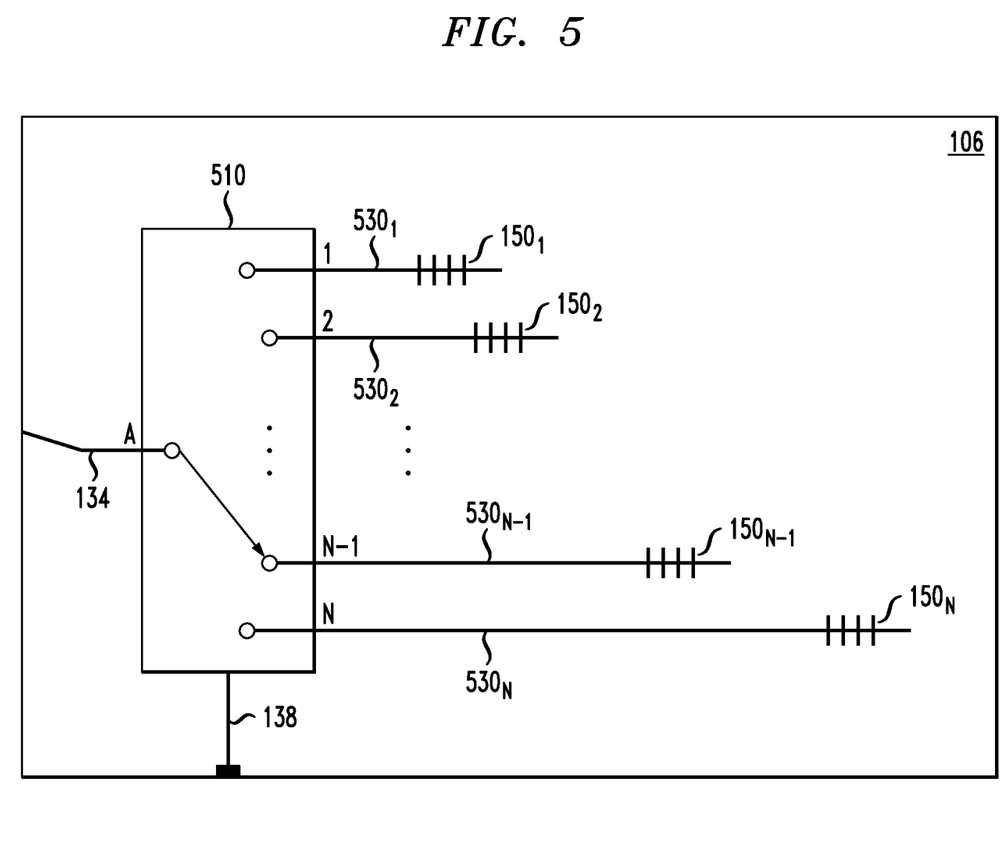
FIG. 5 shows a schematic top view of a PIC that can be used in the ML semiconductor laser of FIG. 1 according to an alternative embodiment.

FIG. 5 shows a schematic top view of PIC 106 according to an alternative embodiment. In the shown embodiment, PIC 106 comprises a 1×N switch 510, where N is a positive integer greater than one. Although the embodiment shown in FIG. 2 corresponds to N>4, embodiments in which N=2 or 3 can be constructed as well, e.g., in a similar manner.

The (N+1) ports of switch 510 are labeled A, 1, 2, . . . , N. The state of switch 510 can be controlled, e.g., by applying an appropriate control signal to electrical bus 138 (also see FIG. 1). In response to this control signal, switch 510 can go into one of N different states. In the first state, switch 510 connects the ports A and 1 thereof. In the second state, switch 510 connects the ports A and 2 thereof, and so on. In the (N−1)-th state, switch 510 connects the ports A and (N−1) thereof. In the N-th state, switch 510 connects the ports A and N thereof.

Port 1 of switch 510 is connected to an optical path that includes an optical waveguide $530_1$ and mirror $150_1$. Port 2 of switch 510 is connected to an optical path that includes an optical waveguide $530_2$ and mirror $150_2$, and so on. Port (N−1) of switch 510 is connected to an optical path that includes an optical waveguide $530_{N-1}$ and mirror $150_{N-1}$. Port N of switch 510 is connected to an optical path that includes an optical waveguide $530_N$ and mirror $150_N$. Each of mirrors $150_1$-$150_N$ is illustratively shown in FIG. 5 as being a DBR mirror, although other types of mirrors can similarly be used.

Optical waveguides $530_1$-$530_N$ have different respective lengths and are configured to operate as fixed delay elements. In some embodiments, a variable delay element (not explicitly shown in FIG. 5) can be inserted, e.g., between at least one optical waveguide $530_i$ and the corresponding mirror $150_i$, where the index "i" can be any integer value from the range [1, N].

Using different states of switch 510, PIC 106 of FIG. 5 can provide N different selectable effective lengths for laser cavity 160 (FIG. 1). As already explained above, the different effective cavity lengths available in an embodiment of laser 100 employing PIC 106 of FIG. 5 can be used to generate optical output beam 102 whose frequency spacing $\Delta f$ is changeable, e.g., for a total of at least N different values of $\Delta f$.

As already indicated above, one possible application of laser 100 can be in the field of WDM networks.

Another possible application of laser 100 can be in the field of RF-photonics carrier generation. In this field, two laser beams whose carrier frequencies are separated by a fixed frequency are heterodyned on a photodiode to generate an electrical RF signal having a carrier frequency equal to the frequency separation between the laser beams. Due to the relatively high bandwidth of the corresponding optics, RF signals with carrier frequencies of up to several hundred GHz can be generated with relative ease in this manner. However, to maintain a low RF-carrier linewidth and good frequency stability, the two laser beams need to be phase- and frequency-locked to one another. The latter normally requires complicated control circuitry and high-speed electronics that can make the corresponding laser system relatively complicated and/or expensive. In contrast, when an ML laser (such as laser 100, FIG. 1) is heterodyned on a photodiode, the need for the complicated control circuitry and high-speed electronics is obviated because the comb lines in the optical output (e.g., 102, FIG. 1) of the ML laser are inherently phase- and frequency-locked to one another. As a result, a narrow and stable electrical RF carrier corresponding to the output-comb frequency spacing $\Delta f$ can be generated. The use of laser 100 for this purpose also advantageously enables the generated electrical RF carrier to be tunable, e.g., as may be required for use in an RF receiver configured to operate over several RF channels having different respective frequencies.

According to an example embodiment disclosed above in reference to FIGS. 1-5, provided is an apparatus (e.g., 100, FIG. 1) comprising: a laser cavity (e.g., 160, FIG. 1) including an optical waveguide (e.g., 112/134, FIG. 1) and a waveguide circuit (e.g., 140, FIG. 1) connected between a first light reflector (e.g., 110 or 150, FIG. 1) and a second light reflector (e.g., 150 or 110, FIG. 1), the optical waveguide including an active section (e.g., 120, FIG. 1) and a mode-locking section (e.g., 130, FIG. 1), the active section being configured to generate light in response to an electrical current being driven therethrough, the mode-locking section being configured to modulate the light to cause an optical pulse train (e.g., 102 and/or 152, FIG. 1) to be emitted from the laser cavity through the first light reflector; wherein the waveguide circuit comprises one or more optical switches (e.g., 210, FIGS. 2-3; 510, FIG. 5) configured to connect the optical waveguide and the second light reflector using a plurality of optical paths (e.g., including $220_1$-$220_N$ and $230_1$-$230_N$, FIGS. 2-3; $530_1$-$530_N$ FIG. 5) through the waveguide circuit; and wherein at least two (e.g., $530_1$ and $530_N$, FIG. 5) of the plurality of optical paths have different respective optical lengths.

In some embodiments of the above apparatus, the one or more optical switches are configurable (e.g., using 138, FIG. 1) to select any one of the plurality of optical paths to optically connect the optical waveguide and the second light reflector.

In some embodiments of any of the above apparatus, the plurality of optical paths are configured to enable the laser cavity to emit the optical pulse train whose comb-frequency spacing (e.g., Δf) is variable (e.g., as shown in FIGS. 4A-4D).

In some embodiments of any of the above apparatus, the plurality of optical paths are configured to make the comb-frequency spacing changeable at least by a factor of 1.5 (e.g., as shown in FIGS. 4A and 4B).

In some embodiments of any of the above apparatus, the one or more optical switches include one or more 1×2 switches (e.g., $210_i$, FIGS. 2-3).

In some embodiments of any of the above apparatus, the one or more 1×2 switches include one or more Mach-Zehnder interferometer switches (e.g., 210, FIG. 3).

In some embodiments of any of the above apparatus, the one or more optical switches include a 1×N switch (e.g., 510, FIG. 5), where N is an integer greater than two.

In some embodiments of any of the above apparatus, the second light reflector includes a plurality of mirrors (e.g., $150_1$-$150_{N+1}$, FIG. 2), each of the mirrors being connected to an end of a respective one of the plurality of optical paths.

In some embodiments of any of the above apparatus, at least one of the plurality of mirrors comprises a distributed Bragg reflector (e.g., $150_i$, FIGS. 3, 5).

In some embodiments of any of the above apparatus, at least three (e.g., $530_1$, $530_2$, and $530_N$, FIG. 5) of the plurality of optical paths have different respective optical lengths.

In some embodiments of any of the above apparatus, at least four (e.g., $530_1$, $530_2$, $530_{N-1}$, and $530_N$, FIG. 5) of the plurality of optical paths have different respective optical lengths.

In some embodiments of any of the above apparatus, the waveguide circuit comprises two or more serially connected stages (e.g., including $240_1$-$240_N$, FIG. 2), each of the serially connected stages including a respective one of the optical switches.

In some embodiments of any of the above apparatus, at least one of the serially connected stages includes a tunable delay element (e.g., $220_i$ or $230_i$, FIG. 2).

In some embodiments of any of the above apparatus, each of the plurality of optical paths includes a respective fixed length of optical waveguide (e.g., $530_1$-$530_N$, FIG. 5).

In some embodiments of any of the above apparatus, the apparatus further comprises a first semiconductor chip (e.g., 104, FIG. 1) and a second semiconductor chip (e.g., 106, FIG. 1) attached to one another using a chip coupler (e.g., 108, FIG. 1), the first semiconductor chip including a first section (e.g., 112, FIG. 1) of the optical waveguide, the second semiconductor chip including a second section (e.g., 134, FIG. 1) of the optical waveguide, the chip coupler connecting the first section and the second section to enable propagation of the light therebetween.

In some embodiments of any of the above apparatus, the first chip includes the active section.

In some embodiments of any of the above apparatus, the second chip includes the waveguide circuit.

In some embodiments of any of the above apparatus, the first chip includes the first light reflector.

In some embodiments of any of the above apparatus, the second chip includes the second light reflector.

In some embodiments of any of the above apparatus, the first chip comprises a III-V semiconductor.

In some embodiments of any of the above apparatus, the second chip comprises silicon.

In some embodiments of any of the above apparatus, the mode-locking section comprises at least one of a saturable absorber, an acousto-optic modulator, an electro-optic modulator, and an electro-absorption modulator.

In some embodiments of any of the above apparatus, the laser cavity is configured to: emit a first optical pulse train (e.g., 102, FIG. 1) through the first light reflector; and emit a second optical pulse train (e.g., 152, FIG. 1) through the second light reflector.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising:
a mode-locked laser including an optical waveguide and a waveguide circuit connected between a first light reflector and a plurality of second light reflectors, the optical waveguide including an active section and a mode-locking section, the active section being configured to generate light in response to an electrical current being driven therethrough;
wherein the waveguide circuit comprises a sequence of two or more optical switches operable to optically connect a selected one of the second light reflectors to the optical waveguide via a corresponding optical path; and
wherein different ones of the optical paths have different optical-path lengths.

2. The apparatus of claim 1, wherein the sequence of two or more optical switches is configurable to select among the optical paths to optically connect the optical waveguide and the selected one of the second light reflectors.

3. The apparatus of claim 2, wherein the optical paths are configured to enable the mode-locked laser to emit an optical pulse train whose comb-frequency spacing is variable.

4. The apparatus of claim 3, wherein the optical paths are configured to make the comb-frequency spacing changeable at least by a factor of 1.5.

5. The apparatus of claim 1, wherein the sequence of optical switches includes three or more 1×2 optical switches.

6. The apparatus of claim 5, wherein the three or more 1×2 optical switches include one or more Mach-Zehnder interferometer switches.

7. The apparatus of claim 1, wherein the plurality of second light reflectors includes a plurality of mirrors, each of the mirrors being connected to an end of a respective one of the optical paths.

8. The apparatus of claim 7, wherein at least one of the plurality of mirrors comprises a distributed Bragg reflector.

9. The apparatus of claim 1, wherein at least three of the optical paths have different respective optical-path lengths.

10. The apparatus of claim 9, wherein at least four of the optical paths have different respective optical-path lengths.

11. The apparatus of claim 1, further comprising a first semiconductor chip and a second semiconductor chip attached to one another using a chip coupler, the first semiconductor chip including a first section of the optical waveguide, the second semiconductor chip including a second section of the optical waveguide, the chip coupler connecting the first section and the second section to enable propagation of the light therebetween.

12. The apparatus of claim 11,
wherein the first chip includes the active section; and
wherein the second chip includes the waveguide circuit.

13. The apparatus of claim 11,
wherein the first chip includes the first light reflector; and
wherein the second chip includes the plurality of second light reflectors.

14. The apparatus of claim 11,
wherein the first chip comprises a III-V semiconductor; and
wherein the second chip comprises silicon.

15. The apparatus of claim 1, wherein the mode-locking section comprises at least one of a saturable absorber, an acousto-optic modulator, an electro-optic modulator, and an electro-absorption modulator.

16. The apparatus of claim 1, wherein the laser is configured to:
emit a first optical pulse through the first light reflector; and
emit a second optical pulse through the selected second light reflector.

17. The apparatus of claim 1, wherein the mode-locking section is configured to modulate the light to produce an optical pulse.

18. An apparatus comprising:
a laser cavity including an optical waveguide and a waveguide circuit connected between a first light reflector and a second light reflector, the optical waveguide including an active section and a mode-locking section, the active section being configured to generate light in response to an electrical current being driven therethrough, the mode-locking section being configured to modulate the light to cause an optical pulse train to be emitted from the laser cavity through the first light reflector;
wherein the waveguide circuit comprises two or more serially connected stages and two or more optical switches configured to connect the optical waveguide and the second light reflector using a plurality of optical paths through the waveguide circuit, each of the serially connected stages including a respective one of the optical switches; and
wherein at least two of the plurality of optical paths have different respective optical lengths.

19. The apparatus of claim 18, wherein at least one of the serially connected stages includes a tunable delay element.

20. An apparatus comprising:
a laser including an optical waveguide and a waveguide circuit connected between a first light reflector and a plurality of second light reflectors, the optical waveguide including an active section and a mode-locking section, the active section being configured to generate light in response to an electrical current being driven therethrough, the mode-locking section being configured to modulate the light to cause an optical pulse train to be emitted from the laser through the first light reflector;
wherein the waveguide circuit comprises a sequence of optical switches operable to optically connect a selected one of the second light reflectors to the optical waveguide via a corresponding optical path;
wherein different ones of the optical paths have different optical-path lengths; and
wherein the sequence of optical switches includes three or more 1×2 switches.

21. The apparatus of claim 20, wherein the three or more 1×2 switches include one or more Mach-Zehnder interferometer switches.

* * * * *